United States Patent [19]

Jeon

[11] Patent Number: 5,705,867
[45] Date of Patent: Jan. 6, 1998

[54] INSULATING PLATE WITH SUPPORT FOR TERMINAL PLATE OF AN ALTERNATOR

[75] Inventor: Yong Tak Jeon, Seoul, Rep. of Korea

[73] Assignee: Mando Machinery Corporation, Gunpo

[21] Appl. No.: 660,364

[22] Filed: Jun. 7, 1996

[30] Foreign Application Priority Data

Jun. 13, 1995 [KR] Rep. of Korea ............... 1995-15557

[51] Int. Cl.[6] ...................................... H02K 11/00
[52] U.S. Cl. ................... 310/68 C; 310/68 D; 310/71
[58] Field of Search .................. 310/68 C, 68 D, 310/71

[56] References Cited

U.S. PATENT DOCUMENTS 4,189,653  2/1980  Hiratuka et al. ............... 310/68 D
5,043,614  8/1991  Yockey ........................... 310/68 D
5,451,823  9/1995  Deverall et al. ............... 310/68 D
5,453,648  9/1995  Bradfield ........................ 310/68 D

FOREIGN PATENT DOCUMENTS 3-70047  7/1991  Japan.

Primary Examiner—Steven L. Stephan
Assistant Examiner—Tran N. Nguyen
Attorney, Agent, or Firm—Foley & Lardner

[57] ABSTRACT

An insulating plate for a vehicle alternator has a semi-circular body with insulating bushes formed at both ends of the body and an extension formed at one end of the body to support the bottom of a terminal plate of the alternator. A pair of vertical walls are formed on both sides of the extension to tightly grasp the sides of terminal plate. The body of the insulated plate also has at least one protective guide hole to guide the phase leads which extend from the stator to the rectifier.

8 Claims, 5 Drawing Sheets

INSULATING PLATE WITH SUPPORT FOR TERMINAL PLATE OF AN ALTERNATOR

BACKGROUND OF THE INVENTION

1. Field of the Invention

The present invention concerns an insulating plate, mounted below a rectifier of a vehicle alternator, for insulating the stator coil from the housing of the vehicle alternator. The vehicle alternator comprises heat radiation plates arranged between the insulating plate and an electrical circuit board, and a terminal plate with a terminal bolt for converting alternating current into direct current. The terminal plate is interposed between one of the heat radiation plates and the insulating plate.

2. Description of the Related Art

The vehicle alternator has a rotator driven by the vehicle engine, and its general structure comprises, as shown in FIG. 1, a pair of casings 10, 11 for sealingly enclosing a rotator 20 having a rotating shaft 21 connected with the engine, a pair of bearings 30 and 31 for supporting the rotating shaft 21, a stator 40 fixedly attached on the inner peripheral surface of the casings 10, 11, and a pair of cooling fans 50, 51 fixedly mounted on both side of the rotator 20. One end of the rotating shaft 21 is extended outside the casings 10, 11 and has a pulley 60 connected with the engine via a belt, etc.

The other end of the rotating shaft 21 is attached with a slip ring 70, on which brush 90 is supported by means of a brush holder 80 and a spring 81. A voltage regulator 100 is mounted on one side of the brush 90. A rectifier 110 is arranged below the rotating shaft 21. These elements are sealingly enclosed by a rear case 130. Also provided below the rectifier lid is an insulating plate 140, which insulates the stator coil connected with the rectifying diode circuit of the rectifier 110 from the rear casing 11.

An electrical circuit board 150 is mounted opposite to the insulating plate, as shown in FIGS. 2 and 3. FIG. 2 illustrates the components inside the bottom half of the case 130 viewed in the direction "A" indicated in FIG. 1. FIG. 3 is an elevation of FIG. 2 viewed in the direction "B" indicated in FIG. 2. The heat radiation plate 160 of the rectifier 110 is interposed between the insulating plate 140 and the electrical circuit board 150. A terminal plate 170 with a terminal bolt 180 is arranged between the insulating plate 140 and the electrical circuit board 150 in order to convert alternating current into direct current.

Referring to FIGS. 4A and 4A, the conventional insulating plate 140 has a semi-circular shape with bushes 141 for insulating the positive and negative heat radiation plates 160 at both ends, and a guide projection 142 for tightly holding one end of the terminal plate 170. The insulating plate 140 also has lead passages 143 insulated from the rear casing 11 to guide the three phase leads (not shown) of the stator 40.

Such conventional insulating plate cannot prevent moisture from penetrating into the alternator when the vehicle operates during rainy days or along a coast. Namely, foreign matters such as moisture, dust, etc. penetrate through the lead passages 143 into the alternator. Consequently, they penetrate into the fine gaps between the terminal plate 170 and the heat radiation plate 160 causing electrical corrosion of the internal components of the alternator. Moreover, it is very difficult to draw out the three phase leads through the lead passages 143 because the lead passages 143 are too narrow.

Japanese Laid-Open Utility Model Publication No. Pyoung 3-70047 discloses passage holes which are arranged in a rear bracket to guide the three phase leads from the stator coil to the rectifier and which are provided with insulating lead covers. The lead covers are designed to cover the three phase leads and to seal the gaps between the holes and the leads so as to prevent the penetration of foreign matters. However, because the leads are tightened in the holes by means of the lead covers, it becomes very difficult to pull out the three phase leads.

SUMMARY OF THE INVENTION

It is an object of the present invention to provide an alternator with an insulating plate for preventing foreign matters such as moisture, dust, etc. from penetrating into the alternator.

It is another object of the present invention to provide an insulating plate with means for facilitating the pulling out of the three leads of the stator coil.

According to the present invention, an insulating plate for a vehicle alternator comprises a semi-circular body, insulating bushes vertically formed at both ends of the body, an extension formed at one end of the body for supporting the bottom of the terminal plate, a pair of vertical walls formed on both sides of the extension to tightly grasp both sides of terminal plate, and at least one protective guide hole vertically formed at a proper position of the insulating plate to guide three phase leads. The protective guide hole includes an outer wall vertically formed on the body of the insulating plate, and an inner wall inclined towards the upper end of the outer wall, so that the inner diameter of its lower end is greater than that of its upper end to thus impart a upwardly tapered shape to the hole and thereby facilitate the drawing of the phase leads from the stator coil to the rectifier.

The present invention will now be described more specifically with reference to the drawings which illustrate an exemplary embodiment of the invention.

The accompanying drawings, which are incorporated in and constitute a part of the specification, illustrate presently preferred exemplary embodiments of the invention, and, together with the general description given above and the detailed description of the preferred embodiments given below, serve to explain the principles of the invention.

DETAILED DESCRIPTION OF THE PREFERRED EMBODIMENT

Figure 1:
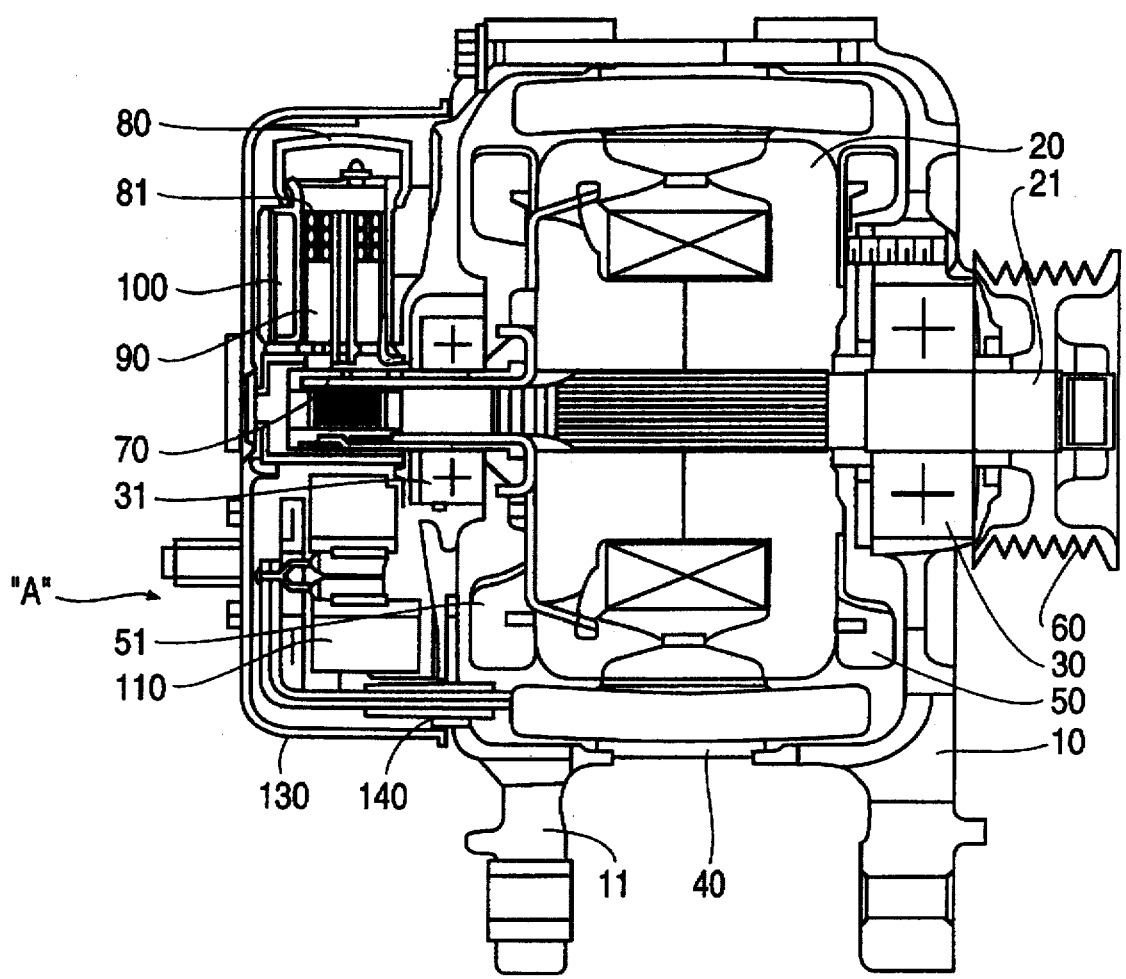
FIG. 1 is a cross sectional side elevation of a conventional vehicle alternator.
Figure 2:
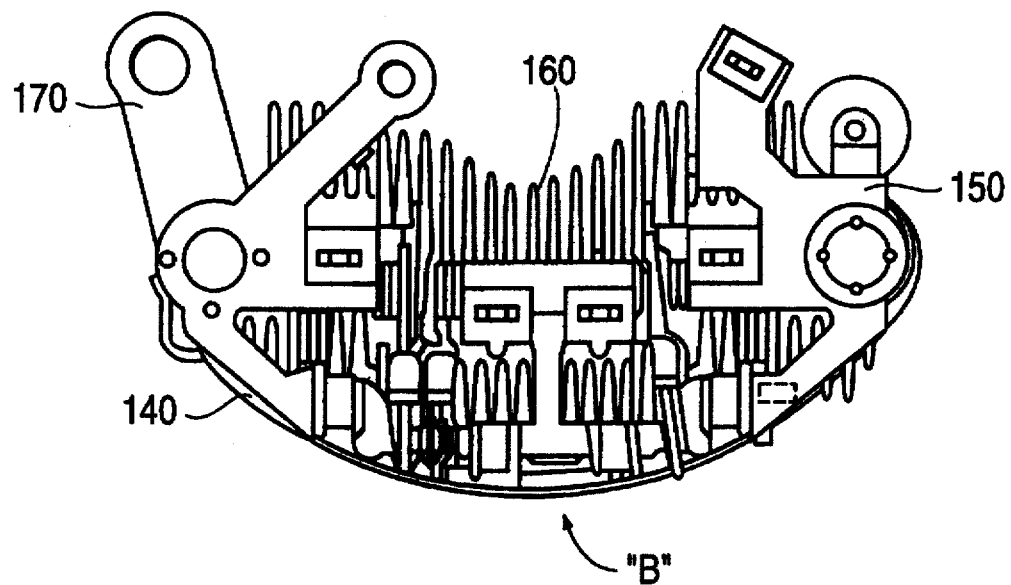
FIG. 2 illustrates a heat radiation plate, having an electrical circuit board at one side, viewed in the direction of arrow "A" of FIG. 1.
Figure 3:
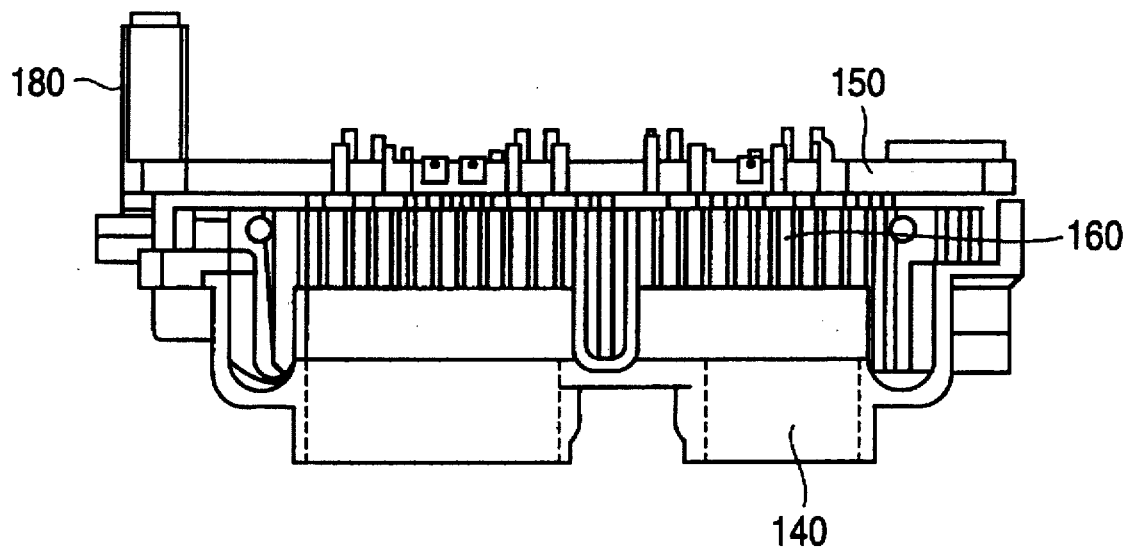
FIG. 3 is an elevation of the heat radiation plate, having a conventional insulating plate at the back, viewed in the direction of arrow "B" of FIG. 2.
Figure 4A:
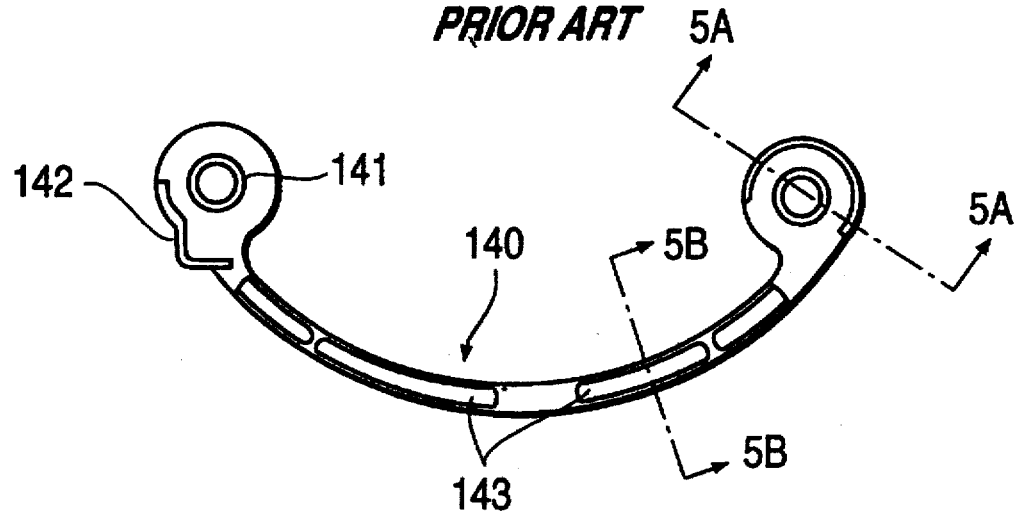
FIG. 4A is a plane view of the conventional insulating plate.
Figure 4B:
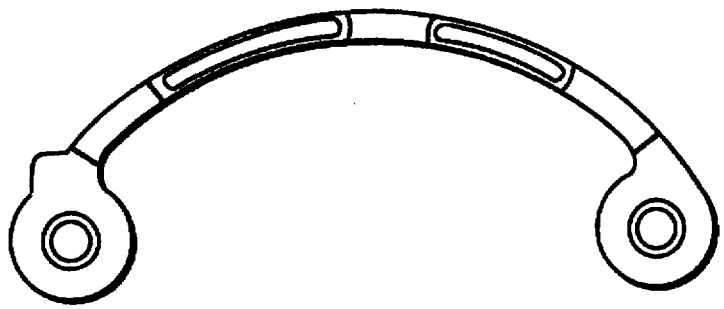
FIG. 4B is a bottom view of the conventional insulating plate.
Figure 5A:
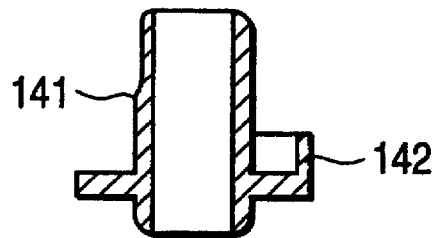
FIG. 5A is a cross sectional view taken along line 5A—5A of FIG. 4A.
Figure 5B:
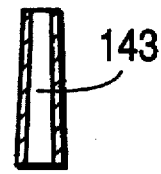
FIG. 5B is a cross sectional view taken along line 5B—5B of FIG. 4A.
Figure 6A:
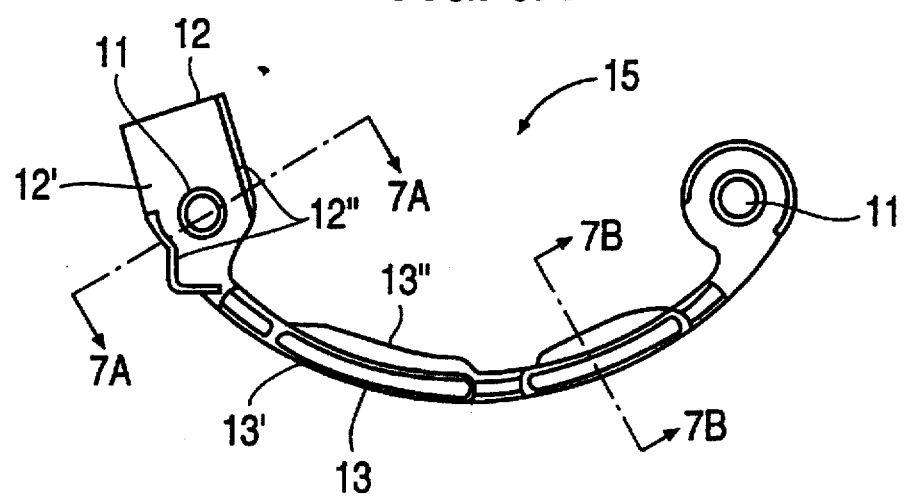
FIG. 6A is a plane view of an insulating plate according to the present invention.
Figure 6B:
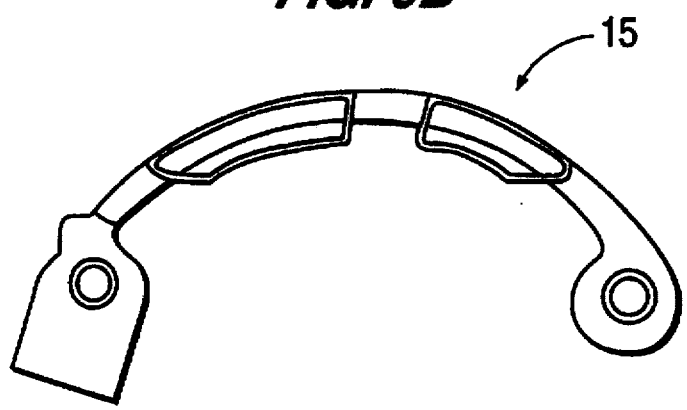
FIG. 6B is a bottom view of the insulating plate of FIG. 6A.
Figure 7A:
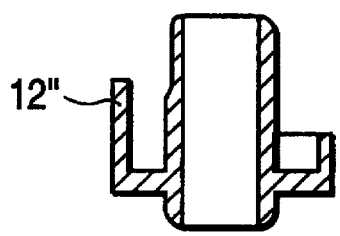
FIG. 7A is a cross sectional view taken along line 7A—7A of FIG. 6A.
Figure 7B:
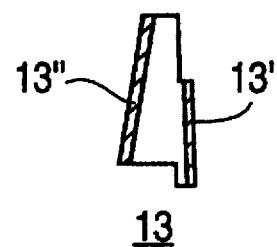
FIG. 7B is a cross sectional view taken along line 7B—7B of FIG. 6A.

Referring to FIGS. 6A and 6B, the insulating plate 15 according to the invention has insulating bushes 11 vertically formed at both ends, which are substantially formed in the same way as the bushes 141 of the conventional insulating plate 140. The characteristic features of the insulating plate 15 are a holding part 12 vertically formed at one end of the insulating plate 15 to support both sides of a terminal plate 170, and at least one protective guide hole 13 vertically formed at a proper position of the insulating plate to guide the three phase leads of the stator coil of an alternator.

The holding part 12 is formed by an extension of one end of the insulating plate 15, and includes a bottom surface 12' for supporting the bottom of the terminal plate 170 and a pair of vertical walls 12– for fixing both sides of one end of the terminal plate 170.

The protective guide hole 13 includes an outer wall 13' vertically formed on body of the insulating plate 15, and an inner wall 13" inclined towards the upper end of the outer wall 13', so that the inner diameter of its lower end may be greater than that of its upper end to impart a upwardly tapered shape to the hole.

Figure 8:
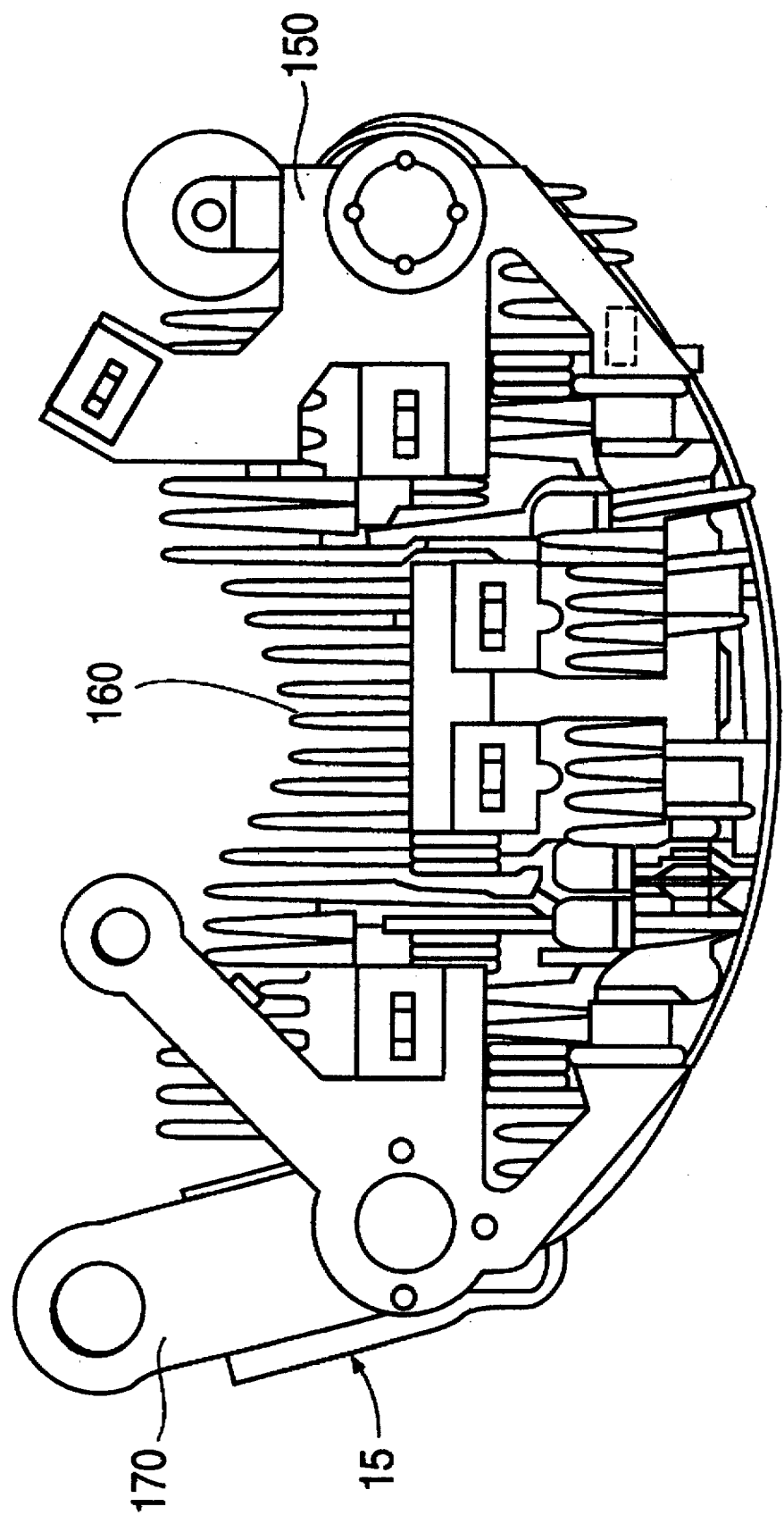
FIG. 8 illustrates the heat radiation plate, having the insulating plate according to the invention, viewed in the direction of arrow "A" of FIG. 1.

As shown in FIG. 8, a pair of heat radiation plates 160 having different polarity are arranged between the insulating plate 15 and the electrical circuit board 150 with the plates separated from each other. Interposed between one of the heat radiation plates 160 and the insulating plate 15 is a terminal plate 170 with a terminal bolt for converting alternating current into direct current in a surface contacting manner.

Both sides of the terminal plate 170 is firmly held between the vertical walls 12" of the holding part 12, and its bottom is supported by the bottom surface 12', which seals the gap between the side of the terminal plate 170 and the (–) heat radiation plate, so that, when a vehicle operates during rainy days or along a coast, the inside of the alternator is prevented from being attacked by foreign matters such as salty moisture, dust, etc. In contrast, the conventional structure is attacked by salty moisture, etc. entering through fine gaps existing between the terminal plate and the heat radiation plate so as to result in corrosion of the components of the alternator.

For connection of the three phase leads with the diode circuit of the rectifier 110 through the protective guide hole 13, the inner wall 13" is inclined upwardly towards the upper end of the outer wall 13' so to form the upwardly tapered passage for guiding the three phase leads, thus facilitating the drawing out of the leads.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An insulating plate of a vehicle alternator which includes a terminal plate with a terminal bolt for converting alternating current into direct current, said insulating plate comprising:

a semi-circular body including inner and outer walls which form at least one protective guide hole for guiding phase leads of the alternator, the inner wall being inclined with respect to the outer wall to define a taper for the guide hole, the inner wall also being offset with respect to the outer wall so that an opening of the guide hole at one end has a center axis which is oblique with respect to a center axis of an opening at the other end of the guide hole; and an extension at one end of said body to support the terminal plate of the alternator.

2. An insulating plate as recited in claim 1, wherein said extension includes a bottom support and a pair of walls supporting both sides of the terminal plate.

3. An insulating plate as recited in claim 1, further comprising an insulating bush at each end of said body, one of the insulating bushes being formed through the bottom support of said extension.

4. A vehicle alternator comprising:

a terminal plate with a terminal bolt for converting alternating current into direct current; and an insulating plate including a semi-circular body having inner and outer walls which form at least one protective guide hole for guiding phase leads of the alternator, the inner wall being inclined with respect to the outer wall to define a taper for the guide hole, the inner wall also being offset with respect to the outer wall so that an opening of the guide hole at one end has a center axis which is oblique with respect to a center axis of an opening at the other end of the guide hole, and an extension at one end of said body to support the terminal plate of the alternator, the extension having a bottom support and a pair of walls supporting both sides of the terminal plate.

5. An insulating plate of a vehicle alternator which includes a terminal plate with a terminal bolt for converting alternating current into direct current, said insulating plate comprising:

a semi-circular body including inner and outer walls which define an opening therebetween, the inner wall being inclined with respect to the outer wall to define a taper for the opening, the inner wall also being offset with respect to the outer wall so that the opening at one end has a center axis which is oblique with respect to a center axis of the opening at the other end; and an extension at one end of said body to support the terminal plate of the alternator.

6. An insulating plate as recited in claim 5, wherein the inner and outer walls define at least one protective guide hole for guiding phase leads of the alternator.

7. An insulating plate as recited in claim 5, further comprising an insulating bush at each end of said body, one of the insulating bushes being formed through the bottom support of said extension.

8. An insulating plate as recited in claim 5, wherein the extension has a bottom support and a pair of walls supporting both sides of the terminal plate.

* * * * *